(12) United States Patent
Harada et al.

(10) Patent No.: US 9,786,797 B2
(45) Date of Patent: Oct. 10, 2017

(54) GRAPHENE NANORIBBON ELECTRONIC DEVICE AND METHOD OF MANUFACTURING THEREOF

(71) Applicant: FUJITSU LIMITED, Kawasaki-shi, Kanagawa (JP)

(72) Inventors: Naoki Harada, Atsugi (JP); Hideyuki Jippo, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/238,973

(22) Filed: Aug. 17, 2016

(65) Prior Publication Data

US 2017/0062627 A1 Mar. 2, 2017

(30) Foreign Application Priority Data

Sep. 2, 2015 (JP) ................... 2015-173228

(51) Int. Cl.
| | | |
|---|---|---|
| H01L 21/00 | (2006.01) | |
| H01L 29/00 | (2006.01) | |
| H01L 29/88 | (2006.01) | |
| H01L 29/16 | (2006.01) | |
| H01L 21/04 | (2006.01) | |
| H01L 29/66 | (2006.01) | |
| H01L 49/02 | (2006.01) | |
| H01L 29/06 | (2006.01) | |

(52) U.S. Cl.
CPC ............ *H01L 29/88* (2013.01); *H01L 21/041* (2013.01); *H01L 28/40* (2013.01); *H01L 29/0665* (2013.01); *H01L 29/1606* (2013.01); *H01L 29/6603* (2013.01)

(58) Field of Classification Search
CPC ............ H01L 21/041; H01L 21/02527; H01L 21/02444; H01L 29/88; H01L 29/417; H01L 29/1606; H01L 28/40; H01L 28/60; B82Y 30/00; B82Y 40/00; B82Y 10/00
See application file for complete search history.

(56) References Cited

U.S. PATENT DOCUMENTS 8,168,964 B2 * 5/2012 Hiura .................... B82Y 10/00
257/14
2003/0205457 A1 11/2003 Choi et al.
(Continued)

FOREIGN PATENT DOCUMENTS

| JP | 2004-002409 | 1/2004 |
| JP | 2013-046028 | 3/2013 |

OTHER PUBLICATIONS

Gorjizadeh et al., "Chemical Functionalization of Graphene Nanoribbons", 2010, Journal of Nanomaterials, vol. 2010, Article ID 513501, pp. 1-7, Dec. 2010.*
(Continued)

*Primary Examiner* — Nikolay Yushin
(74) *Attorney, Agent, or Firm* — Fujitsu Patent Center

(57) ABSTRACT

An electronic device, includes: a graphene nanoribbon having a first graphene and a second graphene; a first electrode coupled to the first graphene; and a second electrode coupled to the second graphene, wherein the first graphene is terminated on an edge by a first terminal group and has a first polarity and the second graphene is terminated on an edge by a second terminal group different to the first terminal group and has a second polarity different from the first polarity.

16 Claims, 12 Drawing Sheets

(56) References Cited

U.S. PATENT DOCUMENTS

2010/0102292 A1* 4/2010 Hiura ............... B82Y 10/00
257/9
2011/0089404 A1* 4/2011 Marcus ............. B82Y 30/00
257/29

OTHER PUBLICATIONS

M. Patrashin et al., "GaAsSb/InAlAs/InGaAs Tunnel Diodes for Millimeter Wave Detection in 220-330-GHz Band", IEEE Transactions on Electron Devices, vol. 62, No. 3 (Mar. 2015), pp. 1068-1071.
I. Bahl et al. "Microwave Solid State Circuit Design", Wiley, New York (1988), 16 pages.
T. Takahashi et al., "Energy Band Control of GaAsSb-Based Backward Diodes to Improve Sensitivity of Millimeter-Wave Detection", Japanese Journal of Applied Physics 49, (2010), pp. 104101-1 to 104101-6, 7 pages.
H. M. Manohara et al., "Carbon Nanotube Schottky Diodes Using Ti-Schottky and Pt-Ohmic Contacts for High Frequency Applications", Nano Letters. vol. 5, No. 7, (2005), pp. 1469-1474 (6 pages).
Y.W. Son et al., "Energy Gaps in Graphene Nanoribbons", Physical Review Letters, PRL 97, pp. 216803-1 to 216803-4 (2006) 4 pages.
Junji Haruyama, "Introduction to Single Electron Tunneling", Corona Publishing Co., Ltd., (2002), 21 pages, Partial English Translation.
J. Cai et al., "Atomically precise bottom-up fabrication of graphene nanoribbons", Nature, vol. 466 (Jul. 22, 2010), pp. 470-473, (4 pages).

\* cited by examiner

FIG. 2A
FIG. 2B
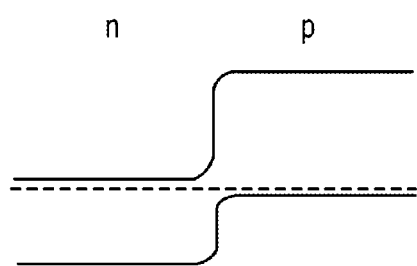
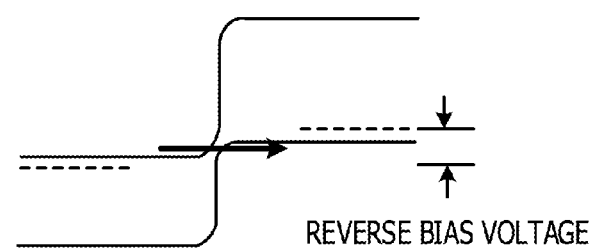
REVERSE BIAS VOLTAGE

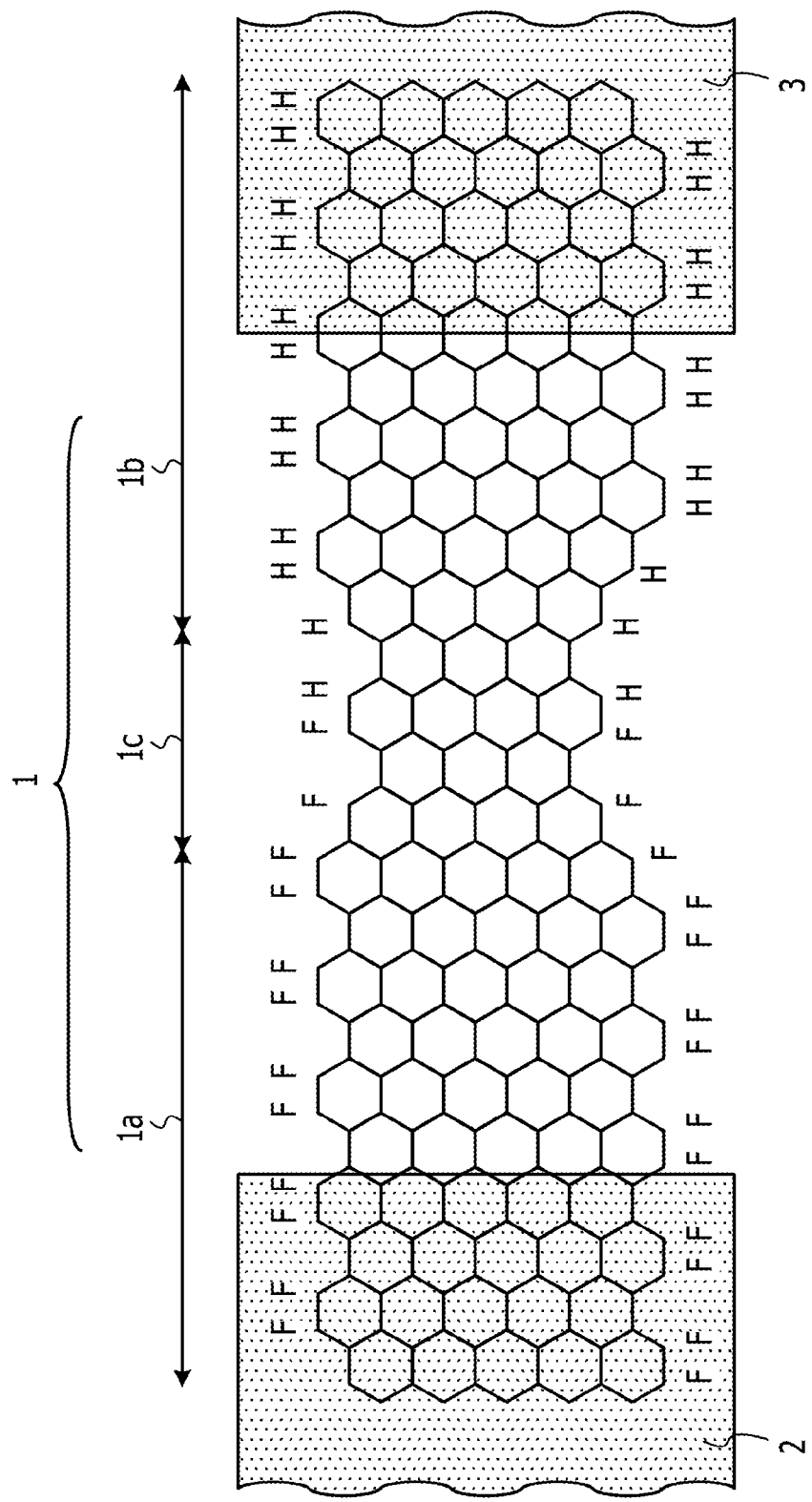

GRAPHENE NANORIBBON ELECTRONIC DEVICE AND METHOD OF MANUFACTURING THEREOF

CROSS-REFERENCE TO RELATED APPLICATION

This application is based upon and claims the benefit of priority of the prior Japanese Patent Application No. 2015-173228, filed on Sep. 2, 2015, the entire contents of which are incorporated herein by reference.

FIELD

The embodiment discussed herein is related to an electronic device and a method of manufacturing thereof.

BACKGROUND

Demand is increasing for high capacity wireless communication at high speeds. Since a wide frequency bandwidth is desired to transmit large volumes of data, utilization of the terahertz band is being investigated. The wording "terahertz band" generally indicates a region from 100 GHz to 10 THz. Since the limiting frequency of current semiconductor electronic devices is approximately 1 THz, further speed increases in electronic devices are being demanded to utilize the terahertz band.

Related technologies are disclosed in Japanese Laid-open Patent Publication No. 2004-2409, Japanese Laid-open Patent Publication No. 2013-46028, M. Patrashin et al., *IEEE Trans. Electron Devices* 62, 1068 (2015), I. Bahl and P. Bhartia, *Microwave Solid State Circuit Design*, Wiley, N. Y., 1988, T. Takahashi et al., *Jpn. I. Appl. Phys.* 49, 104101 (2010), H. M. Manohara et al., *Nano Lett.* 5, 1469 (2005), Y. W. Son et al. *Phys. Rev. Lett.*, 97, 216803, Haruyama, Junji, *Introduction to Single Electron Tunneling*, Corona Publishing Co., Ltd., 2002, or J. Cai et al., *Nature* 466 (2010), 470 (2006).

SUMMARY

According to an aspect of the embodiments, an electronic device, includes: a graphene nanoribbon having a first graphene and a second graphene; a first electrode coupled to the first graphene; and a second electrode coupled to the second graphene, wherein the first graphene is terminated on an edge by a first terminal group and has a first polarity and the second graphene is terminated on an edge by a second terminal group different to the first terminal group and has a second polarity different from the first polarity.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A and FIG. 2B illustrate an exemplary band of a heterojunction backward diode;

FIG. 9 illustrates an exemplary plan view of a heterojunction backward diode;

DESCRIPTION OF EMBODIMENTS

For example, a semiconductor diode is used as a wave detector for wireless communication. A heterojunction backward diode using a compound semiconductor may be used in an ultrahigh frequency band. The operation of a wave detector in the 220 GHz to 330 GHz band is verified by testing.

Figure 1:
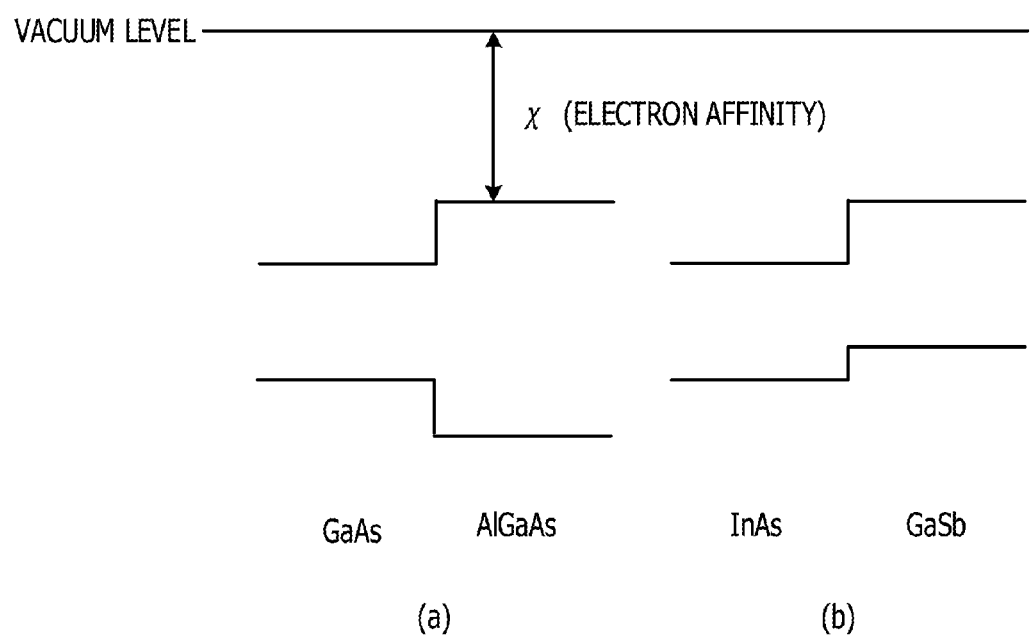
FIG. 1 illustrates an exemplary heterojunction.

The heterojunction backward diode includes a hetero pn-junction having a so-called type II band line up. As illustrated (a) in FIG. 1, there are two types of heterojunction, a type I and a type II. As illustrated (b) in FIG. 1, shifting of the conduction band and the valence band in reverse directions is the type I and shifting in the same direction is the type II.

A GaAs/AlGaAs junction is a representative example of type I and an InAs/GaSb junction is a representative example of type II. The heterojunction backward diode has a structure which uses a type II heterojunction, and in which the side (for example, InAs) having a large electron affinity X is doped to be n-type and the side (for example, GaSb) having a small electron affinity X is doped to be p-type. The n-type region may be referred to as a cathode, and the p-type region may be referred to as an anode. The doping concentration is sufficiently high and each Fermi level may be positioned close to one of the conduction band lower end and the valence band upper end. FIG. 2A illustrates a band diagram of a heterojunction backward diode in an equilibrium state (zero bias) and FIG. 2B illustrates a band diagram of a reverse bias state. In FIG. 2A and FIG. 2B, the broken line indicates a quasi Fermi level. As an effect of adoption of the type II heterojunction, the depletion layer of the junction portion during reverse bias is narrowed and, as a result, electrons present in the valence band of the anode are able to easily move by the tunneling effect to the conduction band of the cathode. The arrow in FIG. 2B indicates the direction in which current flows. The tunneling current is non-linear with respect to the applied voltage and the heterojunction backward diode exhibits a wave detection function. A direct current bias is unnecessary for the tunneling current to directly rise from the origin and the heterojunction backward diode is good at reduction of power consumption and simplicity of circuit configuration.

For example, the performance of diode is indicated by voltage detection sensitivity $\beta_v$. $\beta_v$ is defined by the ratio of output voltage to input power to the diode at the impedance matching condition. As the $\beta_v$ increases, a greater output voltage is obtained with a small input power. $\beta_v$ is represented by the following equation.

$$\beta_V = \frac{\gamma R_j}{2(1+\theta)} \cdot \frac{1}{1+\theta+\theta\omega^2 R_j^2 C_j^2} \quad (1)$$

In the equation (1), $\gamma$ is a parameter that represents the magnitude of non-linearity of the diode current and is defined by $\gamma=(d^2I/dV^2)/(dI/dV)$. $R_j$ is the junction resistance, $\theta=R_s/R_j$ is the ratio of $R_s$ and $R_j$, where $R_s$ is the contact resistance, between the semiconductor and electrode, and $C_j$ is the junction capacitance. The method of increasing $\beta_v$ includes a method of increasing $\gamma$ and a method of decreasing $C_j$. For example, $\beta_v$ is improved by miniaturizing the junction area of the heterojunction backward diode. For example, $\beta_v$ is improved from 2,080 V/W to 10,300 V/W by reducing the diameter of the junction from 3 µm to 1 µm.

The heterojunction backward diode has improved performance through miniaturization thereof. For example, as a result of miniaturizing the junction area to 0.8 µm×0.8 µm, $\beta_v$ of approximately 1,500 V/W at 300 GHz is provided. However, the cutoff frequency $f_c$ is estimated as 322 GHz, and is not necessarily sufficient performance in the region of 1 THz or higher. Further miniaturization becomes more difficult for such reasons as limits on lithography techniques, dimensional accuracy of processing techniques (etching) of compound semiconductors, and the difficulty of forming metal electrodes on a miniaturized junction. Therefore, a method for higher performance that replaces miniaturization by processing technique may be desired.

For example, a miniature element may be manufactured using a basically fine structure that the substance has, rather than miniaturization by processing technique. Since so-called nanocarbons and nanomaterials, such as fullerene, carbon nanotubes, and graphene originally have an nm-sized structure, an nm-sized element may be manufactured.

As an example of such an attempt, a Schottky diode using a carbon nanotube/metal junction is manufactured. For example, a Schottky diode formed from a single walled carbon nanotube (SWNT)/Ti junction is provided. For example, the diameter of SWNT may be 1 nm to 3 nm, and the length may be 1.7 µm to 2.5 µm, and the junction area may be on the order of nm×µm. In the carbon nanotube/metal Schottky diode, the tube radius is on the nm order, and the tube in the length direction remains on the µm order. Accordingly, the junction area is comparatively large, and it may be difficult to say that the voltage detection sensitivity is sufficient. The Schottky diode uses a bias voltage in operation and thus may be more disadvantageous than the heterojunction backward diode on the feature of power consumption and simplicity of circuit configuration. For example, $\beta_v$ of the heterojunction backward diode at 2.5 THz may be estimated as 2.6 V/W.

An electronic device using, for example, a nanotube may be provided as an element configuration using the basic fine structure which the substance has instead of miniaturization by processing technique. However, in such an electronic device, the features of voltage detection sensitivity, power consumption, and simplicity of circuit configuration may be insufficient. For example, an electronic device with improved power consumption and simplicity of circuit configuration than an electronic device using a nanotube and capable of getting high voltage detection sensitivity may be provided.

For example, a heterojunction backward diode may be used as the electronic device.

The constituent material of the heterojunction backward diode may be a graphene nanoribbon (GNR). The GNR is a one-dimensional crystal of graphene, which is a carbon sheet with one or a plurality of atom layers, cut out in a strip shape along a given crystal direction and has a width and thickness on the nm level. The GNR has various electrical characteristics according to the width and the cut-out crystal orientation and, for example, may have the characteristics of a semiconductor.

Figure 3A:
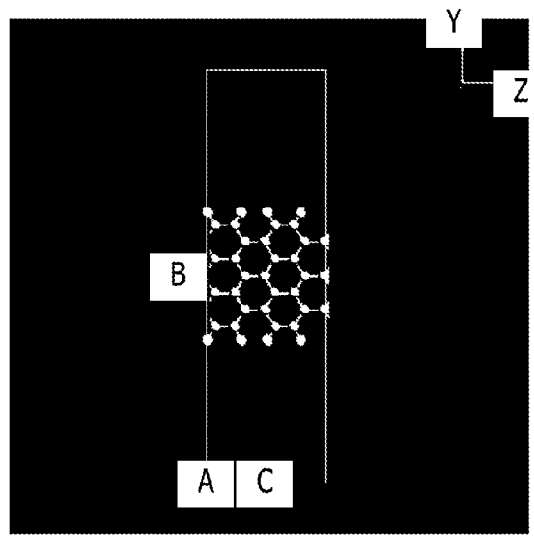
FIG. 3A and FIG. 3B illustrate exemplary AGNR structure and calculation result of band structure.
Figure 3B:
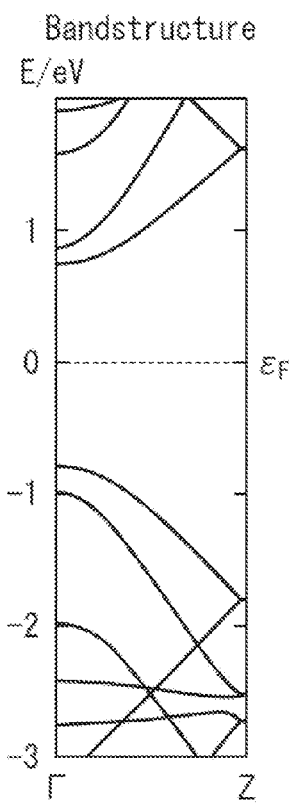

FIG. 3A and FIG. 3B illustrate exemplary AGNR structure and calculation result of a band structure. In FIG. 3A and FIG. 3B, for example, the structure of the GNR (AGNR) for which the number of carbon atoms N in the width direction (short direction) is 7 and which has an edge in the armchair direction and the calculation results of the band structure are illustrated. The carbons atoms positioned on the edge are terminated by hydrogen. The GNR is an intrinsic semiconductor where the band gap Eg is 1.54 eV.

The GNR has a width and height on the nm level. Therefore, in one hydrogen-terminated AGNR, when the n region and the p region are formed to be adjacent, thereby forming a pn junction, a minute junction having dimensions on the nm level may be formed. However, in the method, a type II heterojunction desired in a heterojunction backward diode may not be formed.

For example, by performing the band calculations while variously setting the edge terminal group of the AGNR, the electron affinity is dependent on the edge terminal group and the type II heterojunction may be formed. The calculation method may be a first principle calculation based on density functional theory.

Figure 4:
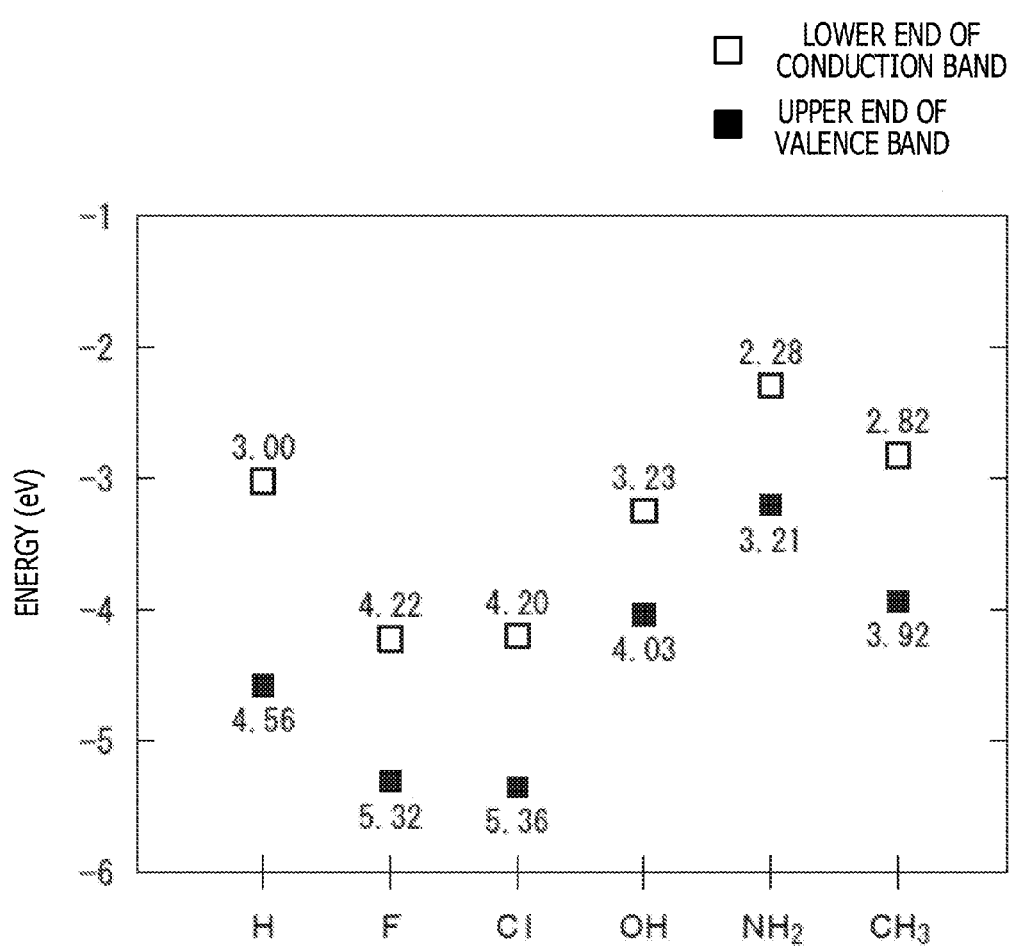
FIG. 4 illustrates exemplary calculation results of an AGNR band line up.

FIG. 4 illustrates exemplary calculation results of an AGNR band line up. In FIG. 4, the calculation results of the band line up of the AGNR in which N=7 and the edge is terminated by various atoms (molecules) are illustrated. Here, the vacuum level is aligned to 0 eV. In this way, the electron affinity x (or the work function φ) of the AGNR is dependent on the edge terminal group.

Figure 5:
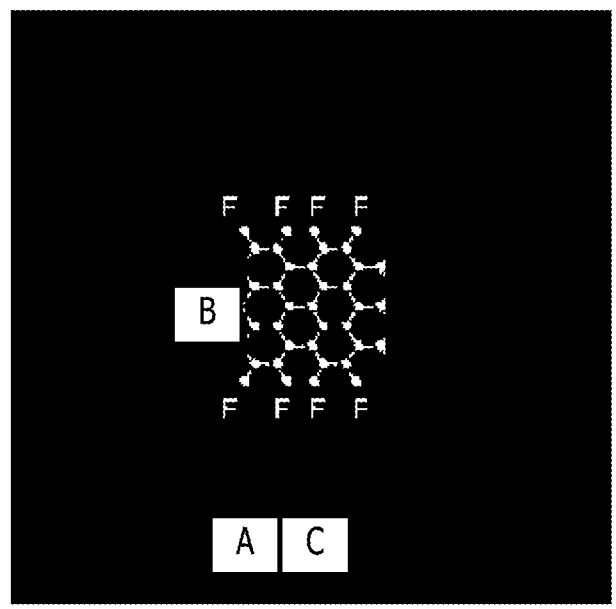
FIG. 5 illustrates an exemplary F-terminated AGNR structure.

FIG. 5 illustrates an exemplary F-terminated AGNR structure. In FIG. 5, a structure of an AGNR (F-terminated AGNR) terminated by F is illustrated. For example, the reason that the work function of the F-terminated AGNR is larger than the AGNR terminated by H (H-terminated AGNR) is thought to be as follows. The degree of electronegativity (by Pauling scale) of F is 3.98 and has a greater value than the degree of electronegativity of C (2.55). Electrons in C are drawn to the F side and F is negatively charged and C is positively charged. As a result, a dipole moment is formed from F toward C. In consideration of the withdrawal of electrons from the AGNR, there is desired extra energy to overcome the dipole moment. This is thought to be the reason that the F-terminated AGNR has a higher work function than the H-terminated AGNR.

Accordingly, various heterojunctions are formed by providing regions terminated by different terminal groups to be adjacent in one GNR. In the AGNR, for example, H may be employed in one terminal group, and F may be employed in another terminal group. In FIG. 4, the lower end of the conduction band and the upper end of the valence band of the F-terminated AGNR are arranged further to the low energy side than those of the H-terminated AGNR and a type II heterojunction is formed. A heterojunction backward diode using a GNR based on the above may be provided.

Figure 6:
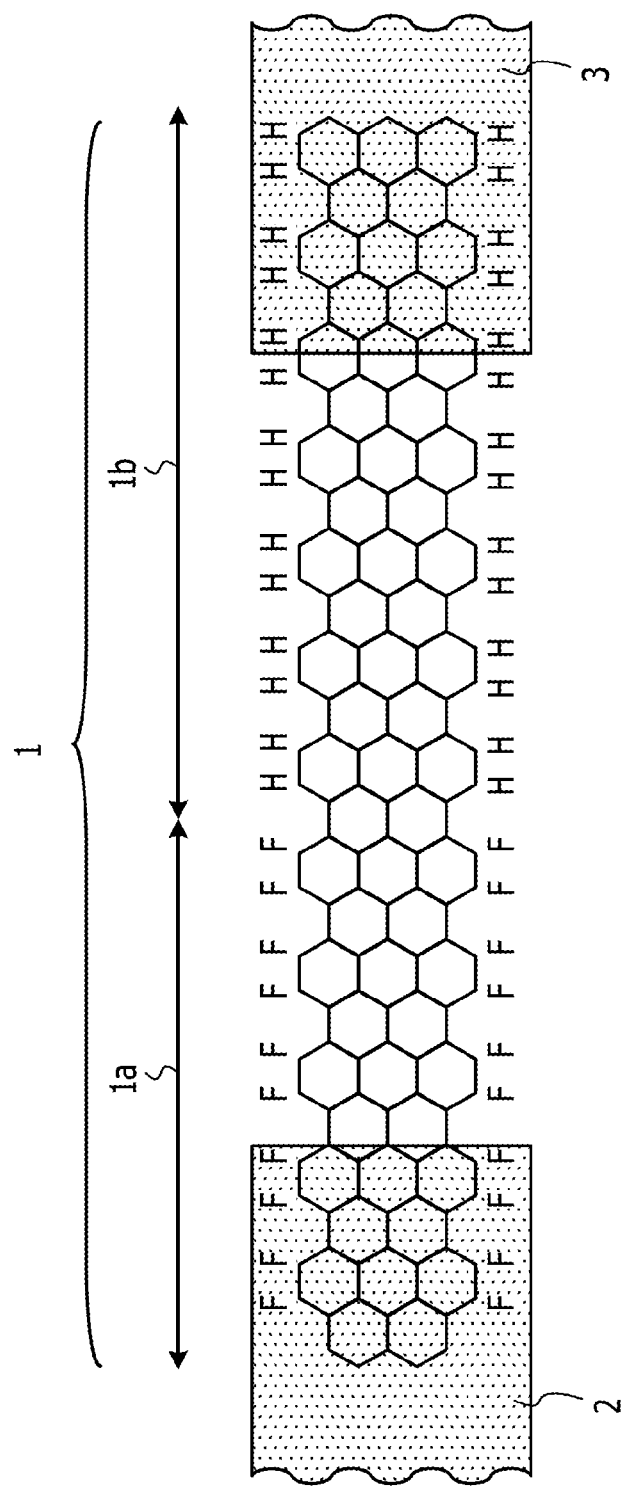
FIG. 6 illustrates an exemplary plan view of a heterojunction backward diode.

FIG. 6 illustrates an exemplary plan view of a heterojunction backward diode. The heterojunction backward diode includes a graphene nanoribbon (GNR) 1, a cathode electrode 2 electrically connected to one end portion of the GNR 1, and an anode electrode 3 electrically connected to another end portion of the GNR 1.

The GNR 1 is formed with a first graphene 1a and a second graphene 1b continuously connected. The first graphene 1a has an edge terminated by a first terminal group and has the first polarity, here, n-type. The second graphene 1b has an edge terminated by a second terminal group and has the second polarity, here, p-type. The first graphene 1a has higher electron affinity than the second graphene 1b.

The combination of the first terminal group of the first graphene 1a and the second terminal group of the second graphene 1b (first terminal group and second terminal group) uses, for example, one combination selected from the following group of combinations. The combinations selected based on FIG. 4 are (F, H), (Cl, H), (F, OH), (Cl, OH), (F, NH$_2$), (Cl, NH$_2$), (F, CH$_3$), (Cl, CH$_3$), (H, NH$_2$), (OH, NH$_2$), (OH, CH$_3$), and (H, OH). A case of (F, H), for example, a case in which F is applied to the first terminal group and H is applied to the second terminal group is illustrated.

In FIG. 6, although a case where the number of carbon atoms N in the width direction (short direction) is 7 is illustrated, there is no limitation thereto. Because the band gap of the GNR 1 is determined according to N (and a modifying group), N is determined after the desired band gap value is determined while taking the operating temperature, operating voltage, and the like into consideration. In FIG. 6, although a case where the number M of carbon atom rows as the gap between the cathode electrode 2 and the anode electrode 3 is 15 is illustrated, there is no limitation thereto. Although it is desirable that the above gap is small under conditions that the gap is longer than the length of the depletion layer formed on the hetero pn junction, the gap may be determined considering the processing technique.

In the heterojunction backward diode, the value in which the width and thickness of the GNR 1 are multiplied becomes the junction area (cross-sectional area of the junction portion of the first graphene 1a and the second graphene 1b of the GNR 1). As the junction area decreases, the voltage detection sensitivity $\beta_v$ increases, and the performance of the diode increases. For example, although the basically fine structure the substance has is used similarly to the electronic device using a nanotube, the junction area is several nm×several nm or less, and the $\beta_v$ is considerably high as compared to an electronic device using a nanotube.

Figure 7:
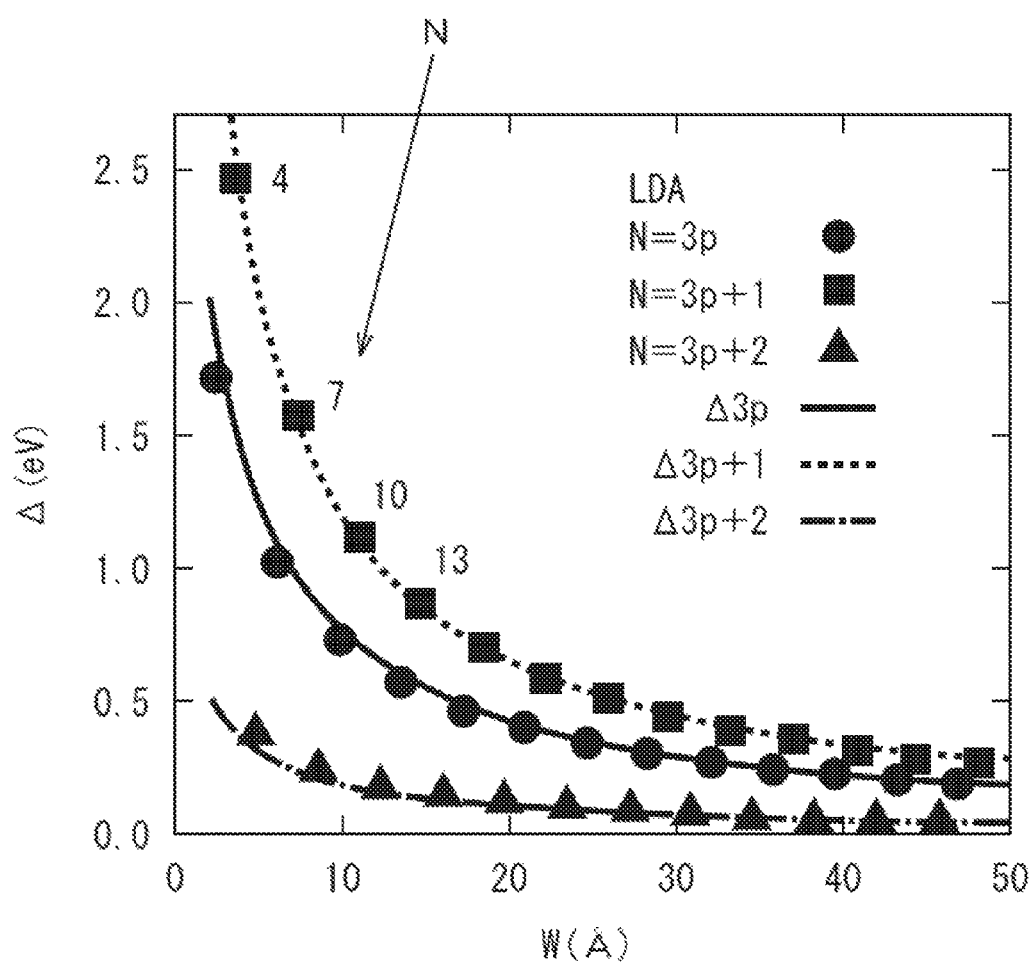
FIG. 7 illustrates exemplary width dependency in an H-terminated GNR band gap.

Selection of the number of carbon atoms N in the width direction is performed. The number of carbon atoms N is substantially equivalent to the width of the GNR 1. For example, although the width and the band gap of the GNR have a substantially inverse relationship, the width and the band gap may be classified according to the remainder when N is divided by 3, as illustrated in FIG. 7. If use of the heterojunction backward diode at room temperature is considered, it is desirable that the band gap is approximately 250 meV or more which is 10 times the approximate heat energy kT (k: Boltzmann constant, T: operating temperature (absolute temperature))=25 meV. Meanwhile, since the tunneling permeability is lowered and the tunneling current is lowered if the band gap is large, approximately 2 eV is considered the upper limit. FIG. 7 illustrates exemplary width dependency in an H-terminated GNR band gap. Based on FIG. 7, N which is a candidate becomes 2, 5, and 8 in a sequence of 3p+2 (p is a natural number), 7 to 43 in a sequence of 3p+1, and 3 to 39 in a sequence of 3p. Among these, even if the maximum N is 43, since the width of the GNR 1 is approximately 5 μm, the thickness of the GNR 1 is approximately 0.34 nm with a single layer graphene, and the junction area is held sufficiently small, the superiority of the diode performance may not be impeded.

According to the above, the number of carbon atoms N in the width direction (short direction) of the GNR 1 may be 2 to 43. Therefore, the junction area becomes sufficiently small and a high voltage detection sensitivity $\beta_v$ is obtained, thereby a high diode performance is secured. The value of N is not limited, and may be selected, as desirable, based on usage at a temperature other than room temperature, restrictions on the power consumption, or the operating voltage conditions.

Figure 8A:
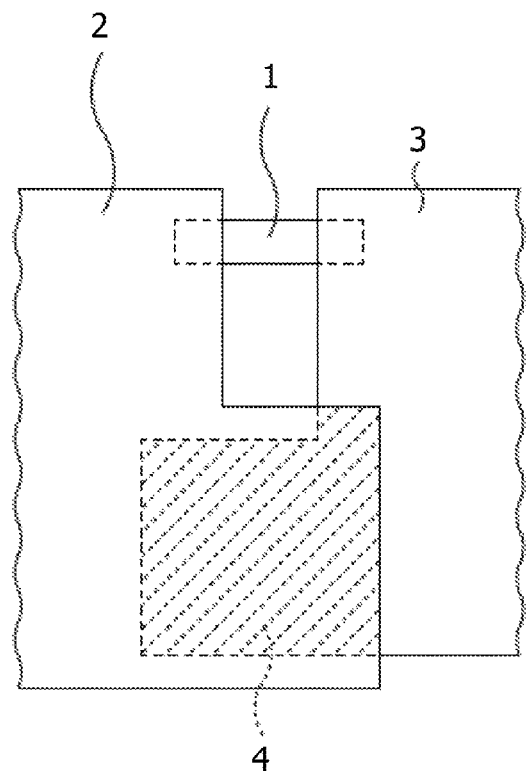
FIG. 8A and FIG. 8B illustrate an exemplary plan view of a cathode electrode and an anode electrode.
Figure 8B:
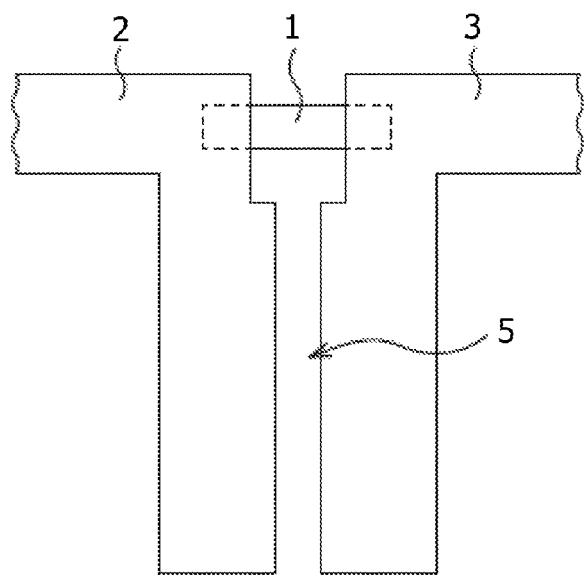

A capacitor is intentionally formed between the cathode electrode 2 and the anode electrode 3, and an additional electrostatic capacitance $C_p$ is secured. FIG. 8A and FIG. 8B illustrate an exemplary plan view of a cathode electrode and an anode electrode.

As illustrated in FIG. 8A, a portion of the cathode electrode 2 is superimposed above a portion of the anode electrode 3 with a certain dielectric film (such as SiN) in between at a position separated, as appropriate, from the GNR 1, and a capacitor 4 is formed at the superimposed portion. The superimposed area, the type and thickness of the dielectric film, and the like of the capacitor 4 are regulated, and the desired electrostatic capacitance $C_p$ is secured.

As illustrated in FIG. 8B, the side surfaces of the cathode electrode 2 and the anode electrode 3 face each other in close proximity at a position separated from the GNR 1, as appropriate, and the capacitor 5 is formed. The separation distance between the cathode electrode 2 and the anode electrode 3, the opposition distance between both, and the like of the capacitor 5 are regulated, and the desired electrostatic capacitance $C_p$ is secured. In FIG. 8B, a dielectric film may be formed between the cathode electrode 2 and the anode electrode 3 and the electrostatic capacitance $C_p$ may be regulated.

FIG. 9 illustrates an exemplary plan view of a heterojunction backward diode. Although the heterojunction backward diode has substantially the same configuration as the heterojunction backward diode in FIG. 3, the heterojunction backward diode differs in the feature of the GNR 1 being different.

In the heterojunction backward diode, the GNR 1 is formed with the first graphene 1a and the second graphene 1b which are continuously connected with a third graphene 1c interposed therebetween. At least one of the width in the short direction, the terminal group of the edge, and the polarity of the third graphene 1c differs from those of the first graphene 1a and the second graphene 1b. A plurality of GNRs which differ in at least one of the width in the short direction, the terminal group of the edge, and the polarity may be formed as the third graphene 1c. The third graphene 1c is formed with a width in the short direction narrower (number of carbon atoms N in the width direction is 9) than the first graphene 1a and the second graphene 1b. The GNR 1 has a larger band gap due to the third graphene 1c aphene is being provided and, as a result, leakage current when a voltage is applied in the forward direction of the GNR 1 may be suppressed.

A non-doped GNR without polarity may be formed as the third graphene 1c. By providing the third graphene 1c, an electrical field at the pn junction is alleviated, and breakdowns may be avoided.

Figure 10A:
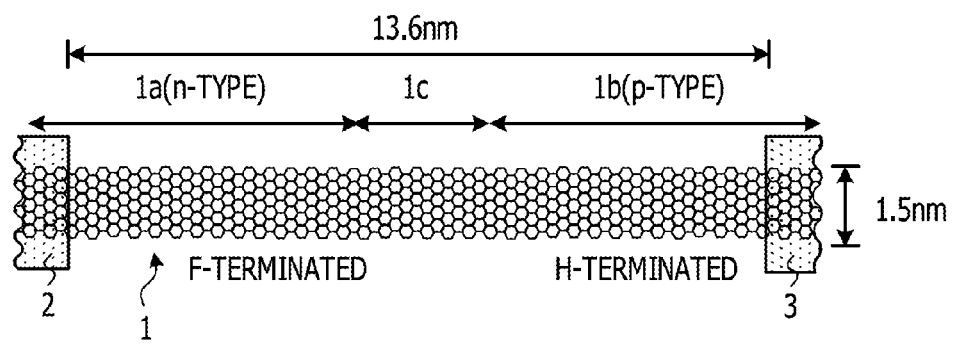
FIG. 10A and FIG. 10B illustrate exemplary configuration of a heterojunction backward diode used in a computer simulation.
Figure 10B:
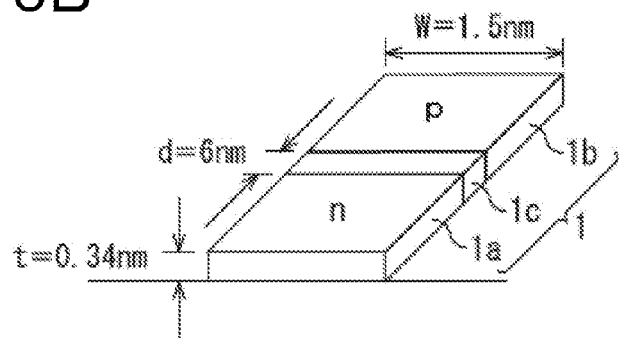
Figure 10C:
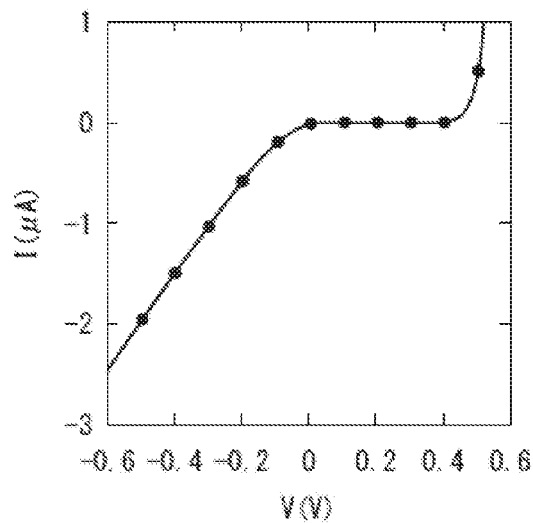
FIG. 10C illustrates an exemplary current and voltage characteristics of the heterojunction backward diode used in the computer simulation.

A computer simulation may be performed for the heterojunction backward diode. FIG. 10A and FIG. 10B illustrate an exemplary configuration of a heterojunction backward diode used in a computer simulation. An AGNR with N=12 is assumed as the GNR 1. For example, the n-type F-terminated first graphene 1a and the p-type H-terminated second graphene 1b are continuously formed with the non-doped (i-type) third graphene 1c without polarity interposed therebetween. The calculation method may be a conduction calculation based on density functional theory, and the transmissivity of the electrons and the current are obtained from a non-equilibrium Green's function. FIG. 10C illustrates exemplary current and voltage characteristics of the heterojunction backward diode used in the computer simulation. The forward direction characteristics are a thermally stimulated current appeared in ordinary pn junctions and which indicate exponential function characteristics. For example, the characteristics of a backward diode such as rising from the origin and increasing non-linearly in backward direction are obtained. It is confirmed that the reverse current is actually due to inter-band tunneling conduction between the valence band of the anode and the conduction band of the cathode. The resistance in the reverse direction in the vicinity of the origin is 584 kΩ, and γ of 10 V$^{-1}$ or more is obtained in the vicinity of the origin. It is confirmed through computer simulation that the heterojunction backward diode exhibits non-linear characteristics.

Figure 11:
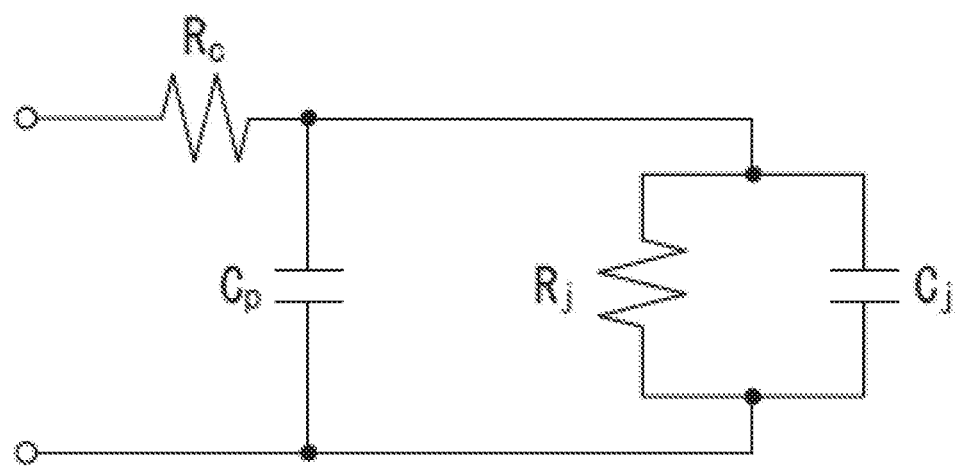
FIG. 11 illustrates an exemplary equivalent circuit used in equivalent circuit analysis.

The voltage detection sensitivity $\beta_v$ of the heterojunction backward diode is estimated based on the results of equivalent circuit analysis. FIG. 11 illustrates an exemplary equivalent circuit used in equivalent circuit analysis. $C_p$ is, among all electrostatic capacitances present between the cathode electrode 2 and the anode electrode 3, a capacitance other than the junction capacitance $C_j$, and includes a parasitic capacitance and an intentional capacitance. At this time, $\beta_v$ is expressed by the following formula (2).

$$\beta_V = \frac{\gamma R_j}{2(1+\theta)} \cdot \frac{1}{1+\theta+\theta\omega^2 R_j^2(C_j+C_p)^2} \quad (2)$$

A value of 1.4×10$^{-21}$ F is obtained for the junction capacitance $C_j$ when a parallel plate capacitor is assumed from the width W, the thickness t, and the depletion layer width d of the junction of the GNR 1 illustrated in FIG. 10B and calculation is performed. As a parasitic capacitance other than $C_j$, there are a fringing capacitance around the junction, a capacitance between the GNR 1 and the substrate, a capacitance of the wiring, and the like. Although reliably obtaining the parasitic capacitance is not easy in some cases, for example, 75 aF is obtained as the total capacitance of the carbon nanotube/metal Schottky diode with a length of 2.5 µm. Since the diameter of the carbon nanotube and the width of the GNR are approximately the same, 75 aF is also assumed here as the $C_p$. Rc is assumed to be 5.84 kΩ from the contact resistance of the metal to the graphene up to present. Other parameter values and $\beta_v$ calculated therefrom are illustrated in the following table. $\beta_v$ is a value one or more digits larger than the value ($\beta_v$=1500) of a compound semiconductor heterojunction backward diode.

TABLE 1

| $C_j$(F) | $C_p$(aF) | $R_j$(kΩ) | $R_c$(kΩ) | Y(V$^{-1}$) | f(GHz) | $\beta_V$(V/W) |
|---|---|---|---|---|---|---|
| 1.4 × 10$^{-21}$ | 75 | 584 | 5.84 | 10 | 300 | 41800 |

Here, the lower limit of the electrostatic capacitance is described. In a tunnel junction having a minute electrostatic capacitance, for example, a Coulomb blockade phenomenon occurs. The Coulomb blockade phenomenon occurs when the electrostatic energy $E_Q=q^2/2C_T$ of the minute capacitance rises above the thermal energy kT. q is the elementary charge, k is the Boltzmann constant, T is the operating temperature (absolute temperature), and $C_T$ is the total electrostatic capacitance ($C_j+C_p$) present between the cathode electrode 2 and the anode electrode 3. In order that the $E_Q$ falls below the thermal energy at room temperature, $C_T$ of $Q^2/2$ kT or more, for example, 3 aF or more is desired. In order that the total capacitance is 3 aF or more, it is desirable that an additional electrostatic capacitance $C_p$ is present with respect to $C_j$. The $C_P$ in Table 1 satisfies these conditions. In a case where $C_p$ does not satisfy the conditions, as illustrated in FIGS. 8A and 8B, the desired electrostatic capacitance $C_p$ is ensured by forming the additional capacitor. According to the above, a high $\beta_v$ is provided in the terahertz band and the electromagnetic wave detection technology in the ultrahigh frequency band is improved according to the heterojunction backward diode.

FIG. 12A to FIG. 12E illustrate an exemplary method of manufacturing a heterojunction backward diode.

Figure 12A:
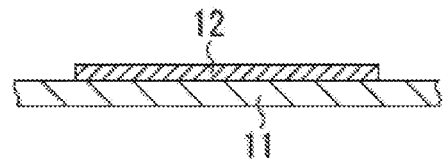
FIG. 12A to FIG. 12E illustrate an exemplary method of manufacturing a heterojunction backward diode.

As illustrated in FIG. 12A, the H-terminated GNR 12 is formed. For example, an anthracene dimer which is a precursor of the GNR, the end portion of which is terminated by H, is used and is bonded on a Au (111) substrate 11 by thermal energy. A Ag (111) substrate may be used instead of the Au (111) substrate. First, the anthracene dimer precursor is vapor deposited on the Au (111) substrate 11 which is heated to approximately 180° C. to 250° C. At this time, the anthracene dimer precursor is connected on a straight line by radical polymerization.

The substrate temperature is raised to approximately 350° C. to 450° C. and the temperature is held for approximately 10 minutes to 20 minutes. According to the above, an armchair anthracene GNR having an average width of approximately 0.7 nm and with the edge structure completed along the longitudinal direction is formed by an annelation reaction. The H-terminated GNR 12 in which the end portion is terminated by H is formed on the Au (111) substrate 11.

Figure 12B:
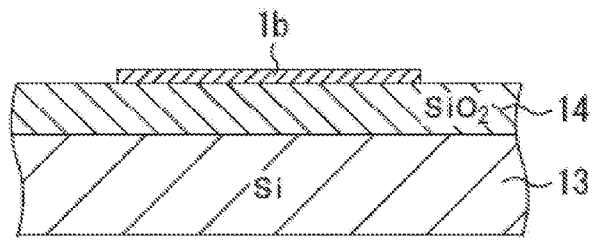

As illustrated in FIG. 12B, the H-terminated GNR 12 is transferred onto the silicon substrate 13. For example, the H-terminated GNR 12 is transferred onto the silicon substrate 13 which includes an insulating film, for example, a silicon oxide film 14, on the surface thereof. At this time, the H-terminated GNR 12 which exposed to the atmosphere becomes p-type due to the adsorption of water molecules and is formed as the p-type second graphene 1b in which the edge is H-terminated. For the p-type doping, a method in which the doping concentration is improved not only by simply exposing in the atmosphere, but also actively depositing, or the like, an organic film with p-type dopant molecules, for example, F$_4$-TCNQ (tetrafluoro-tetracyanoquinodimethane) may be employed.

Figure 12C:
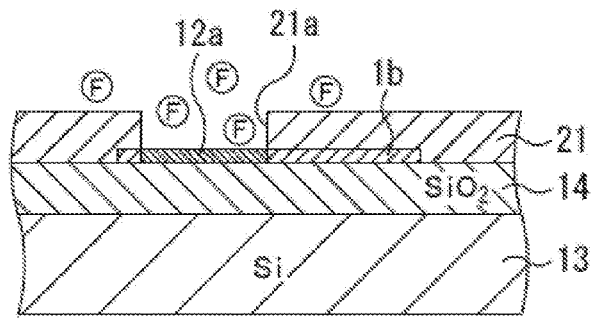

As illustrated in FIG. 12C, the left portion of the second graphene 1b is formed to the F-terminated GNR 12a. For example, a resist is applied to the silicon oxide film 14 so as to cover the second graphene 1b and patterned by a lithography technique, thereby forming a resist mask 21 which has an opening 21*a*. In the resist mask 21, the left portion of the second graphene 1*b* is exposed in the bottom surface of the opening 21*a*.

The silicon substrate 13 is heated in a fluoride atmosphere, and the edge at the left portion of the second graphene 1*b* which is exposed from the opening 21*a* of the resist mask 21 is fluorinated. According to the above, the left portion of the second graphene 1*b* is formed to the F-terminated GNR 12*a*.

Figure 12D:
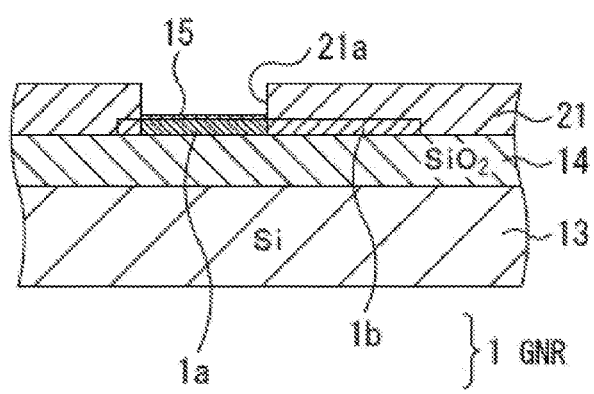

As illustrated in FIG. 12D, the F-terminated GNR 12*a* is formed to the first graphene 1*a*. For example, an organic film having n-dopant molecules, for example, polyethylenimine (PEI: $C_2H_5N$) 15 is deposited on the F-terminated GNR 12*a* exposed from the opening 21*a* of the resist mask 21. The F-terminated GNR 12*a* is doped with n-type dopant molecules by deposition of the PEI 15, thereby forming the first graphene 1*a*. According to the above, the GNR 1 in which the first graphene 1*a* and the second graphene 1*b* are continuously connected is formed on the silicon oxide film 14. The resist mask 21 is removed by an ashing process or a wet process.

Figure 12E:
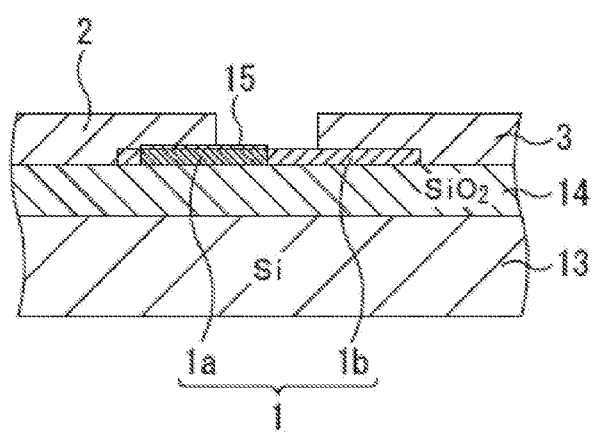

As illustrated in FIG. 12E, the cathode electrode 2 and the anode electrode 3 are formed. For example, the electrode forming sites are patterned by using an ordinary photolithography or electron beam lithography technique, and subsequently vacuum deposition and a lift-off method are executed. According to the above, the cathode electrode 2 and the anode electrode 3 formed from Au (approximate thickness 100 nm) and/or Ti (approximate thickness 10 nm) are formed. The cathode electrode 2 is electrically connected to an end site of the GNR 1, and the anode electrode 3 is electrically connected to the other end site of the GNR 1.

Thereafter, a protective film may be formed, as desirable. According to the above, a heterojunction backward diode is formed.

A highly reliable fine electronic device is provided which uses the basic fine structure which the substance has instead of miniaturization by proseccing technique, in which the power consumption is suppressed with a simple circuit configuration, and which has a high voltage detection sensitivity.

For example, the heterojunction backward diode may be integrated as a diode detector on one chip with a peripheral circuit. In this case, the peripheral circuit element (such as a transistor) manufacturing process is added. Also in this case, a compound semiconductor substrate, such as InP, may be adopted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic device, comprising: a graphene nanoribbon having a first graphene and a second graphene; a first electrode coupled to the first graphene; and a second electrode coupled to the second graphene, wherein the first graphene is terminated on an edge by a first terminal group, includes an n-type doping layer layered on a first portion of a surface of the graphene nanoribbon and has an n-type polarity and the second graphene is terminated on an edge by a second terminal group different to the first terminal group, includes one of a second portion of the surface of the graphene nanoribbon exposed to the atmosphere and a p-type doping layer layered on the second portion of the surface of the graphene nanoribbon and has a p-type second polarity different from the n-type polarity.

2. The electronic device according to claim 1, wherein electron affinity of the first graphene is greater than electron affinity of the second graphene.

3. The electronic device according to claim 1, wherein the first graphene and the second graphene include 2 to 43 carbon atoms in the short direction.

4. The electronic device according to claim 1, wherein the combination of the first terminal group of the first graphene and the second terminal group of the second graphene is one selected from (F, H), (Cl, H), (F, OH), (Cl, OH), (F, $NH_2$), (Cl, $NH_2$), (F, $CH_3$), (Cl, $CH_3$), (H, $NH_2$), (OH, $NH_2$), (OH, $CH_3$), and (H, OH).

5. The electronic device according to claim 1, wherein the graphene nanoribbon has a third graphene coupled between the first graphene and the second graphene and the third graphene differs from the first graphene and the second graphene in at least one of a width in the short direction, the terminal group of the edge, and the polarity.

6. The electronic device according to claim 1, wherein an electrostatic capacitance is formed between the first electrode and the second electrode.

7. The electronic device according to claim 6, wherein the first electrode and the second electrode are partially superimposed with a dielectric interposed between the first electrode and the second electrode to form the electrostatic capacitance.

8. The electronic device according to claim 6, wherein a side surface of the first electrode and a side surface of the second electrode face each other in close proximity and the electrostatic capacitance is formed.

9. The electronic device according to claim 6, wherein the total electrostatic capacitance present between the first electrode and the second electrode is $q^2/2\,kT$ or higher where q is an elementary charge, k is a Boltzmann constant, and T is an operating temperature.

10. A method of manufacturing an electronic device, comprising:
forming a graphene nanoribbon having a first graphene that is terminated on an edge by a first terminal group and has a first polarity and a second graphene that is terminated on an edge by a second terminal group different to the first terminal group and has a second polarity different to the first polarity; and
forming a first electrode coupled to the first graphene and a second electrode coupled to the second graphene,
wherein each of the first graphene and the second graphene are formed by one process of a first process in which each of the first graphene and the second graphene are formed as a p-type by exposing the graphene nanoribbon to the atmosphere or as an n-type by layering an n-type doping layer on a portion of a surface of the graphene nanoribbon and a second process in which each of the first graphene and the second graphene are formed as a p-type by layering a p-type doping layer on a portion of a surface of the graphene nanoribbon or as an n-type by layering an n-type doping layer on a portion of a surface of the graphene nanoribbon.

11. The method according to claim 10, wherein the first polarity of the first graphene is n-type and the second polarity of the second graphene is p-type and electron affinity of the first graphene is greater than electron affinity of the second graphene.

12. The method according to claim 10, wherein the first graphene and the second graphene include 2 to 43 carbon atoms in the short direction.

13. The method according to claim 10, wherein the combination of the first terminal group of the first graphene and the second terminal group of the second graphene is one selected from (F, H), (Cl, H), (F, OH), (Cl, OH), (F, $NH_2$), (Cl, $NH_2$), (F, $CH_3$), (Cl, $CH_3$), (H, $NH_2$), (OH, $NH_2$), (OH, $CH_3$), and (H, OH).

14. The method according to claim 10, wherein the graphene nanoribbon has a third graphene coupled between the first graphene and the second graphene and the third graphene differs from the first graphene and the second graphene in at least one of a width in the short direction, the terminal group of the edge, and the polarity.

15. The method according to claim 10, wherein an electrostatic capacitance is formed between the first electrode and the second electrode.

16. An electronic device, comprising:
a graphene nanoribbon having a first graphene and a second graphene; a first electrode coupled to the first graphene; and
a second electrode coupled to the second graphene,
wherein the first graphene is terminated on an edge by a first terminal group and has a first polarity and the second graphene is terminated on an edge by a second terminal group different to the first terminal group and has a second polarity different from the first polarity,
wherein an electrostatic capacitance is formed between the first electrode and the second electrode,
wherein the total electrostatic capacitance present between the first electrode and the second electrode is $q^2/2\ kT$ or higher where q is an elementary charge, k is a Boltzmann constant, and T is an operating temperature.

* * * * *